United States Patent

Ogahara

[11] Patent Number: 5,958,265
[45] Date of Patent: Sep. 28, 1999

[54] SUBSTRATE HOLDER FOR A PLASMA PROCESSING SYSTEM

[75] Inventor: Yoneichi Ogahara, Tokyo, Japan

[73] Assignee: Anelva Corporation, Fuchu, Japan

[21] Appl. No.: 09/021,405

[22] Filed: Feb. 10, 1998

[30] Foreign Application Priority Data

Apr. 26, 1997 [JP] Japan .................................. 9-166719

[51] Int. Cl.$^6$ ................................................ B23K 10/00
[52] U.S. Cl. .............................. 219/121.43; 219/121.58; 118/725; 165/80.2
[58] Field of Search ......................... 219/121.58, 121.48, 219/121.43, 121.4; 392/416; 118/723 I, 724–729; 165/80.2–80.5, 275; 156/345

[56] References Cited

U.S. PATENT DOCUMENTS

| 5,094,885 | 3/1992 | Selbrede | 118/724 |
| 5,267,607 | 12/1993 | Wada | 165/80.1 |
| 5,571,366 | 11/1996 | Ishii | 156/345 |
| 5,775,416 | 7/1998 | Heimanson et al. | 165/275 |
| 5,868,848 | 2/1999 | Tsukamoto | 118/723 E |

FOREIGN PATENT DOCUMENTS

6-70986  9/1994  Japan .

Primary Examiner—Mark Paschall
Attorney, Agent, or Firm—Burns, Doane, Swecker & Mathis, LLP

[57] ABSTRACT

To eliminate variations in process characteristics by suppressing variations in the temperature of a characteristic correction ring as time passes, a substrate holder holds a substrate 10 while the desired process is performed on the substrate 10 with plasma P. The substrate holder is equipped with a holder main body 1 that holds the substrate 10 in planar contact with a substrate holding surface 20. A substrate temperature regulation mechanism 5 regulates the temperature of the substrate 10 by exchanging heat across the substrate holding surface 20, and a characteristic correction ring 9 surrounds the substrate 10 and corrects variations in process characteristics at the peripheral parts of the substrate 10, wherein the characteristic correction ring 9 is provided with a ring cooling mechanism that prevents the characteristic correction ring 9 from storing up heat from the plasma P and increasing in temperature as time passes. The substrate temperature regulation mechanism 5 also serves as a ring cooling means, being configured with the ability to cool the substrate 10 by causing a temperature medium to circulate inside the holder main body 1, and is provided with a contact improvement means, such as a static adhesion mechanism 6 which improves the thermal contact of the characteristic correction ring 9 against holder main body 1.

11 Claims, 5 Drawing Sheets

SUBSTRATE HOLDER FOR A PLASMA PROCESSING SYSTEM

BACKGROUND OF THE INVENTION

1. Field of Use

The invention of the present application relates to a substrate holder used in a plasma processing system that uses plasma to perform a desired process on the surface of a substrate.

2. Description of Related Art

The use of plasma to perform a desired process on a substrate is frequently encountered in the production of various semiconductor integrated circuits such as DRAMs and in the production of liquid crystal displays. For example, when forming microcircuits on a substrate, plasma is used to etch the substrate by plasma etching in etching stages where a resist pattern is used as a mask. In the fabrication of various conductive films and insulating films, it has become practical to use plasma CVD (chemical vapor deposition) methods which employ vapor-phase reactions in a plasma.

Figure 4:
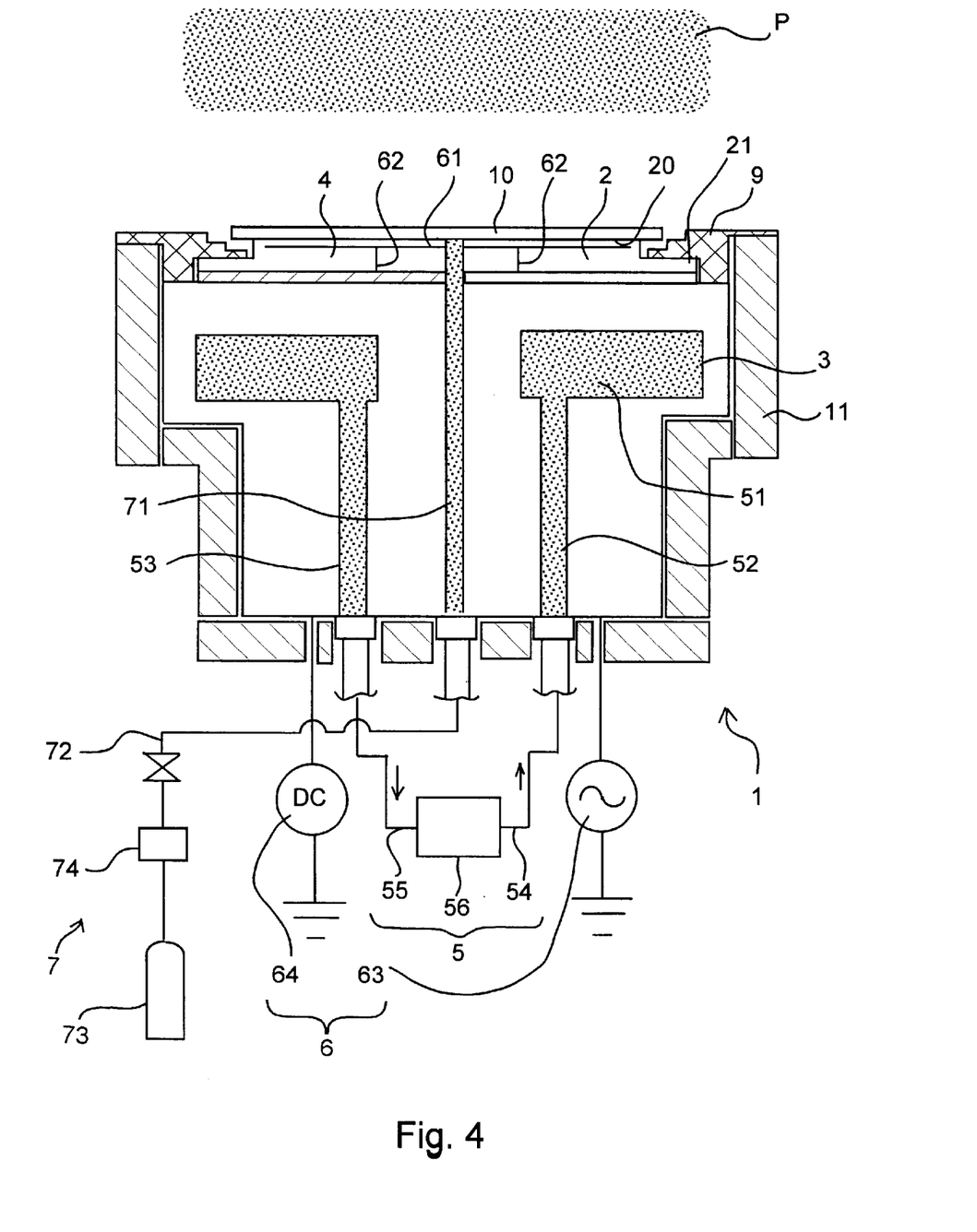
FIG. 4 is a schematic cross-sectional front view of a substrate holder for a conventional plasma processing system.

In this sort of plasma processing system, a substrate holder is needed to hold the substrate that is processed with plasma inside the process chamber. FIG. 4 is a schematic cross-sectional front view showing the structure of a conventional substrate holder for a plasma processing system.

The substrate holder for a plasma processing system (abbreviated to substrate holder in the following) functions as a "mount" that holds and supports the substrate, and as a "temperature regulation means" that regulates the temperature of the substrate. The substrate holder shown in FIG. 4 has a roughly cylindrical holder main body 1 which functions as a "mount" and a substrate temperature regulation mechanism 5 which regulates the temperature by causing a temperature medium to flow through the interior of the holder main body 1.

The holder main body 1 comprises a substrate holding plate 2 which is the member on which the substrate 10 is supported, a main block 3 on which substrate holding plate 2 is mounted, and a contact sheet material 4 which is interspersed between the substrate holding plate 2 and the main block 3.

The upper surface of the substrate holding plate 2 constitutes a substrate holding surface 20. This substrate holding surface 20 is circular, and slightly smaller than the diameter of the substrate 10. Also, a brim part 21 extends out from a position slightly below the substrate holding surface 20.

The main block 3 is made of a metal such as aluminum or stainless steel. The main block 3 is a member which has a roughly cylindrical shape, with the upper parts having a slightly larger diameter.

The contact sheet material 4 is a member for improving the thermal contact between the main block 3 and the substrate holding plate 2. The contact sheet material 4 is formed from a metal such as indium, and is embedded in the gap between the main block 3 and the substrate holding plate 2 so as to improve the thermal contact between the two.

The periphery of the holder main body 1 is covered with an insulating block 11. The insulating block 11 is provided to prevent the holder main body 1 from being damaged by the plasma, and is formed of a heat-resistant insulator such as a fluoroplastic.

The substrate temperature regulation mechanism 5 regulates the temperature by introducing a temperature control medium (abbreviated to temperature medium in this specification) into the main block 3. A temperature medium cavity 51 into which the temperature medium is introduced is formed inside the main block 3. The temperature medium cavity 51 is an annular space with a slightly larger outer diameter than the substrate 10. A temperature medium supply path 52, whereby the temperature medium is supplied to this temperature medium cavity 51, and a temperature medium discharge path 53, whereby the temperature medium is discharged from temperature medium cavity 51, are formed in this temperature medium cavity 51.

The substrate temperature regulation mechanism 51 consists primarily of a temperature medium supply pipe 54 connected to the temperature medium supply path 52, a temperature medium discharge pipe 55 connected to the temperature medium discharge path 53, and a circulator 56, which is provided so as to link the temperature medium supply pipe 54 with the temperature medium discharge pipe 55. A circulator 56 has a temperature regulating part, such as a thermostat, which maintains the temperature medium supplied from the temperature medium supply pipe 54 at a fixed temperature.

The holder main body 1 is provided with a temperature sensor (not illustrated), and the signal from this temperature sensor is fed back so as to maintain the temperature medium at a fixed temperature. Although the choice of temperature medium depends on the temperature being regulated, tap water is often used in typical cases.

To improve the precision of temperature regulation with the substrate temperature regulation mechanism 5, a contact improvement means which improves the planar contact of the substrate 10 against the substrate holding surface 20 is provided. This contact improvement means is formed by an electrostatic chucking mechanism 6 which causes the substrate 10 to be attracted electrostatically to the substrate holding surface 20, and a gas supply mechanism 7 which supplies a specific gas to the gap between the substrate 10 and the substrate holding surface 20.

The electrostatic chucking mechanism 6 primarily consists of a chucking electrode 61 embedded in the substrate holding plate 2, and a high-frequency power source 63 and/or a DC power source 64, which applies a specific voltage to the chucking electrode 61. The substrate holding plate 2 is formed of a dielectric such as alumina (Al2O3).

Specifically, a conductor 62 is embedded so as to reach from the chucking electrode 61 to the contact sheet material 4. The high-frequency power source and the DC power source are connected to the main block 3. Of these, the high-frequency power source 63 applies a self-bias voltage to the substrate 10 by the interaction between the plasma and the high-frequency.

Plasma P is supplied to the top side of the substrate 10. Here, when a high-frequency voltage is applied to the substrate 10 with the substrate holding plate 2, which is made of a dielectric, acting as a capacitor, charged particles in the plasma are periodically attracted to the substrate 10. Electrons, which have high mobility, are attracted to the substrate 10 in greater numbers than ions, and as a result, the potential of the substrate 10 is self-biased in the same way as if a negative DC voltage were superimposed on the high frequency.

Although electrostatic attraction of the substrate 10 can sometimes arise from the induction of static electricity in the surface of the substrate holding plate 2 by this self-bias voltage, the DC power source 64 applies a DC voltage to make this attraction more secure. The DC power source 64 is made to apply a fixed positive voltage to the chucking electrode 61. Since the surface of the substrate holding plate 2 is negatively biased and the chucking electrode 61 has a positive potential, a large potential difference occurs in the dielectric between the adhesion electrode 61 and the substrate holding surface 20, and the dielectric is thereby strongly polarized. As a result, a large static potential is induced in the substrate holding surface 20 and the substrate 10 is electrostatically attracted by the Coulomb force.

A force is also generated by the Johnson-Rahbeck effect between the substrate 10 and the substrate holding surface 20, and the substrate 10 is also attracted by this Johnson-Rahbeck force. The Johnson-Rahbeck force arises from the charge polarization that occurs due to a minute current flowing across the small gap between the substrate 10 and the substrate holding surface 20.

Which of these forces is dominant is determined by the volume resistivity of the dielectric from which the substrate holding plate 2 is formed. The Coulomb force constitutes a larger part of the attraction when the dielectric resistivity is large, and the Johnson-Rahbeck force constitutes a larger part of the attraction when the dielectric resistivity is small.

Meanwhile, as FIG. 4 shows, a gas supply path 71 is formed so as to pass through the main block 3 and the substrate holding plate 2. The gas supply mechanism 7 consists of a gas supply pipe 72 which is connected to a gas supply path 71, and a gas cylinder 73 which holds the gas that is supplied to the gas supply path 71 through the gas supply pipe 72.

The gas supply pipe 72 is provided with a mass-flow controller 73 whereby it is made to supply gas at the desired rate. The tip of the gas supply path 71 is made into an opening formed in the substrate holding surface 20, and the gas from the tip opening is supplied between the substrate 10 and the substrate holding surface 20. The supplied gas is a gas with high thermal conductivity, such as helium.

Neither the back surface of the substrate 10, nor the substrate holding surface 20, is a physically perfect flat surface, and a minute space is formed between the two. In this minute space, no heat is conveyed by direct conduction between the substrate 10 and the substrate holding surface 20. Since the substrate holder is situated in a vacuum in most cases, it is also difficult for heat to be conveyed by gas convection. The gas supplied by the gas supply mechanism 7 to the minute space between the substrate 10 and the substrate holding surface 20 solves this problem by mediating the exchange of heat between the two.

Figure 5:
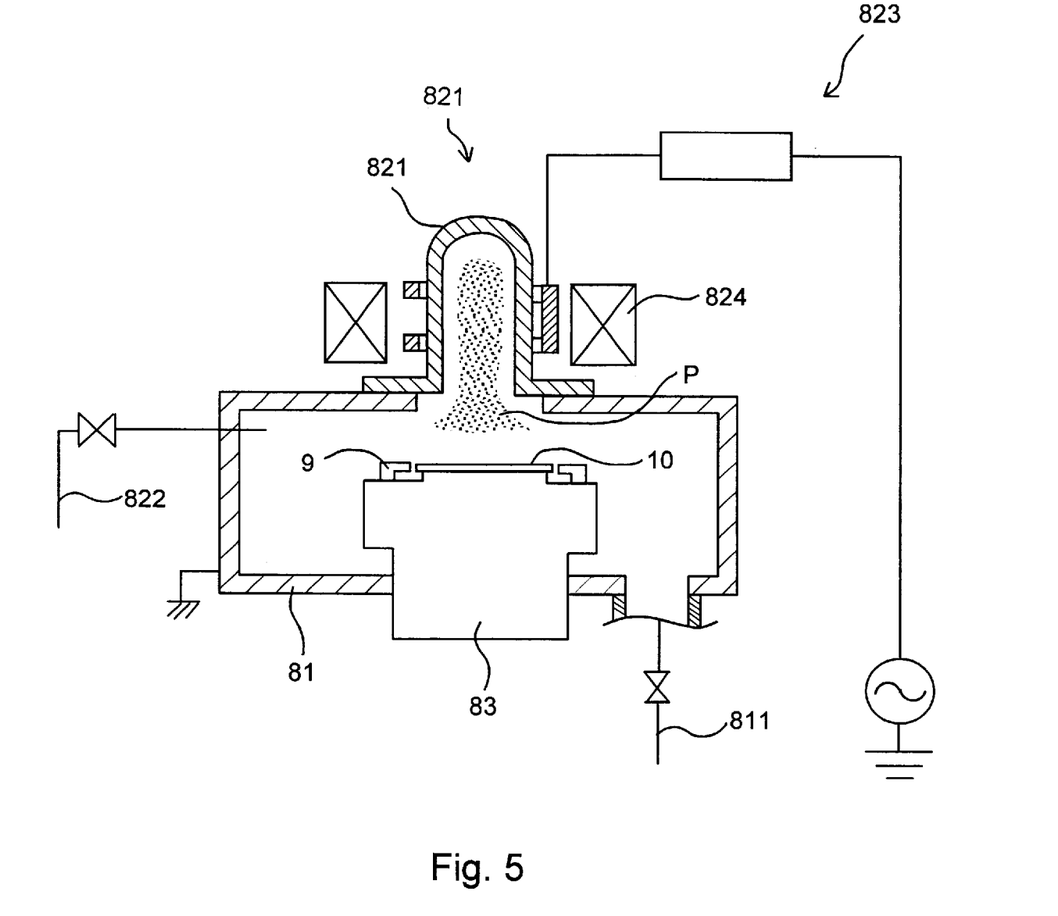
FIG. 5 is a schematic front view of the configuration of a plasma processing system in which the substrate holder shown in FIG. 4 is mounted.

FIG. 5 is a front view showing the schematic configuration of a plasma processing system in which the substrate holder shown in FIG. 4 is mounted.

The plasma processing system shown in FIG. 5 primarily consists of a process chamber 81 equipped with a pump-down system 811, a plasma supply means 82 which supplies plasma P into process chamber 821, and a substrate holder 83 which holds the substrate 10 to be processed by the supplied plasma p.

This plasma processing system forms a helicon wave excited plasma. The plasma supply means 82 primarily consists of a dielectric vessel 821 which has an airtight connection to process chamber 81, a gas supply means 822 which supplies a process gas into the dielectric vessel 821, an electrical power supply means 823 which supplies high-frequency electrical power into the dielectric vessel 821 and thereby turns the gas into a plasma, and an electromagnet 824 which establishes a magnetic field inside the dielectric vessel 821.

The electrical power supply means 823 induces a circularly polarized high frequency wave (a helicon wave) into the dielectric vessel 821 via a loop antenna. This forms a high density plasma inside the dielectric vessel 821. The high density plasma diffuses into the process chamber 81 under the magnetic field established by the electromagnet 824, and is used to process substrate 10.

When performing plasma etching, a fluorocarbon gas such as carbon tetrafluoride ($CF_4$) is used as the process gas. Fluoride ions and/or fluoride active species are produced in the plasma. These ions and/or active species arrive at the substrate 10, whereby the material (e.g., silicon oxide) on the surface of the substrate 10 is etched.

When depositing a thin film of amorphous silicon by plasma enhanced CVD, the plasma is formed by introducing a mixed gas of hydrogen gas and a silane gas such as monosilane ($SiH_4$) as the process gas. Decomposition of the silane gas in the plasma is used to deposit a thin film of amorphous silicon on the surface of substrate 10.

OBJECTS AND SUMMARY

When processes such as these are carried out on substrates, the characteristics of the process can vary within the surface of the substrate. This variation often manifests itself as a pronounced change of characteristics at the peripheral parts of the substrate. Its cause can generally be expressed as an "end surface effect". If a material (including the vacuum atmosphere) differing from that of the substrate exists around the substrate, the process characteristics will change at the peripheral parts of the substrate.

The substrate is heated to some extent by radiation from the plasma and by exposure to charged particles from the plasma. In this case, there is a tendency for the substrate temperature to fall off to a certain extent compared with the central parts due to the dissipation of heat by thermal radiation from the end surface of the substrate. Most processes are temperature-dependent so the process characteristics will vary if the temperature falls off at the peripheral parts.

An effective way to avoid the potentiality of such problems is to situate a member made of the same material as the substrate or of a similar material around the substrate. This member might take the form of a ring that encloses the periphery of the substrate (referred to as a characteristic correction ring in the following). The characteristic correction ring is formed of the same material as the substrate or of a similar material. For example, when the substrate is a silicon wafer, the characteristic correction ring is made of silicon, silicon carbide, carbon, quartz, aluminum or alumetized aluminum.

When nonuniformity of the temperature is corrected with a characteristic correction ring, the characteristic correction ring is heated by the plasma in the same way as the substrate. Heat is radiated from the characteristic correction ring to the substrate, and this heat radiation acts so as to cancel out the heat radiated from the end surface of the substrate. Heat loss at the peripheral parts of the substrate is suppressed, and the temperature uniformity is improved. As a result, the variation in characteristics arising from thermal nonuniformity is eliminated, and highly uniform processing becomes possible.

When processing is performed while consuming chemical species generated in the plasma, or when processing is performed while generating specific chemical species by surface reactions on the substrate, a problem arises in that the consumption of chemical species and generation of chemical species is lower at the peripheral parts of the substrate than at the center of the substrate. This can lead to the occurrence of variation in the process characteristics at the peripheral parts. In this case, if a characteristic correction ring is provided as mentioned above, the chemical species are consumed and/or generated in the same way at the characteristic correction ring so that the variation of characteristics is corrected and processing is performed uniformly.

The configuration in which a characteristic correction ring is used is described in further detail with reference to FIG. 4. FIG. 4 shows the configuration of a characteristic correction ring whose use is under investigation along with the configuration of a conventional substrate holder.

The characteristic correction ring 9 is situated so as to enclose the circumference of the held substrate 10. Specifically, the characteristic correction ring 9 is mounted with its lower surface on the outer edge of the main block 3. The characteristic correction ring 9 also has an inwardly-oriented protrusion, and this protrusion is mounted on the brim part 21 of the substrate holding plate 2.

A step is formed in the upper surface of the protrusion as shown in FIG. 4. This step is matched to the shape of the wafer support claws (not illustrated) of the transport mechanism which passes the substrate 10 over to the wafer holder. The cross-sectional profile of the characteristic correction ring 9 engages with the circumferential end of the substrate support plate 2 and is situated concentrically with respect to the substrate 10.

The characteristic correction ring 9 is not provided as a part of the holder main body 1, nor is it provided integrally with the holder main body 1. This is because the characteristic correction ring 9 must be replaced for maintenance purposes. The characteristic correction ring 9 is also subjected to the same processing as the substrate 10 to a certain extent. When plasma etching is performed on the substrate 10, the characteristic correction ring 9 is also etched to some extent, and will become deformed as it gets thinner with the passage of time. Accordingly, the characteristic correction ring 9 must be replaced with a new part after processing has been repeated a certain number of times.

The inventor's studies have shown that variations in process characteristics occur at the peripheral parts of the substrate once processing has been repeated a substantial number of times, and that the characteristic correction ring 9 will act less normally.

Having made a thorough investigation of the factors behind this, the inventor has shown that it is caused by the characteristic correction ring 9 accumulating heat and becoming hotter as time passes. The characteristic correction ring 9 is heated by the heat from plasma P, but this heat is not released before the process is repeated so that its temperature increases as time passes.

In the case of plasma etching, the temperature of the substrate 10 is regulated to about 100° C. When etching is performed with a high-density plasma of about $10^{10}$ to $10^{11}$ electrons per cubic centimeter, the characteristic correction ring 9 stores up heat as time passes and its temperature rises to about 200–300° C. after the repeated processing of a number of substrates.

When the characteristic correction ring 9 heats up in this way, the amount of heat radiated toward the substrate 10 also increases, and thus the temperature also increases at the peripheral parts of the substrate 10. As a result, during repeated processing, the temperature of the peripheral parts of the substrate 10 becomes greater than at the center, leading to variation in the process characteristics.

The invention of the present application has been made in order to solve such problems, and aims to provide a substrate holder that can reduce or eliminate variation of process characteristics by suppressing increases of the characteristic correction ring's temperature as time passes.

To solve the abovementioned problems, the substrate holder is provided with a characteristic correction ring which encloses the circumference of the substrate and corrects variations in the process characteristics. The characteristic correction ring is provided with a ring cooling means which prevents the characteristic correction ring from storing up heat from the plasma and increasing in temperature as time passes. Furthermore, the substrate holder may be equipped with a holder main body made into a substrate holding surface whose surface makes planar contact with and supports the substrate, and a substrate temperature regulation mechanism which performs heat exchange across the substrate holding surface to maintain the substrate at a fixed temperature. This substrate holder is used in a plasma processing system which forms plasma inside a process chamber and uses this plasma to perform a desired process on a substrate.

Also, the substrate temperature regulation mechanism may regulate the substrate to a fixed temperature by cooling it. The characteristic correction ring makes planar contact with the holder main body and is cooled by the abovementioned substrate temperature regulation mechanism. The substrate temperature regulation mechanism serves as the ring cooling means.

Also, the characteristic correction ring may have a contact improvement means so as to make it contact the holder main body with good thermal conductivity. This contact improvement means may consist of either an electrostatic chucking mechanism that causes the characteristic correction ring to adhere electrostatically to the holder main body, or a mechanical clamp mechanism that mechanically presses the characteristic correction ring against the holder main body, or a combination of the static adhesion mechanism and the mechanical clamp mechanism.

Also, the contact improvement means may be equipped with—in addition to the electrostatic chucking mechanism or the mechanical clamp mechanism, or both of these—a gas supply mechanism that supplies a heat-exchange gas between the characteristic correction ring and the holder main body to improve the thermal contact.

Also, the contact improvement means may also serve as a means for improving the planar contact of the substrate to the substrate holding surface.

As described above, according to the present invention, the characteristic correction ring is cooled by a ring cooling means so that the temperature of the characteristic correction ring is prevented from increasing substantially as time passes due to the storage of heat and it is possible to perform plasma processing with high uniformity. Also, the cost can be reduced and the structure of the holder main body can be simplified.

DETAILED DESCRIPTION OF THE PREFERRED EMBODIMENTS

Figure 1:
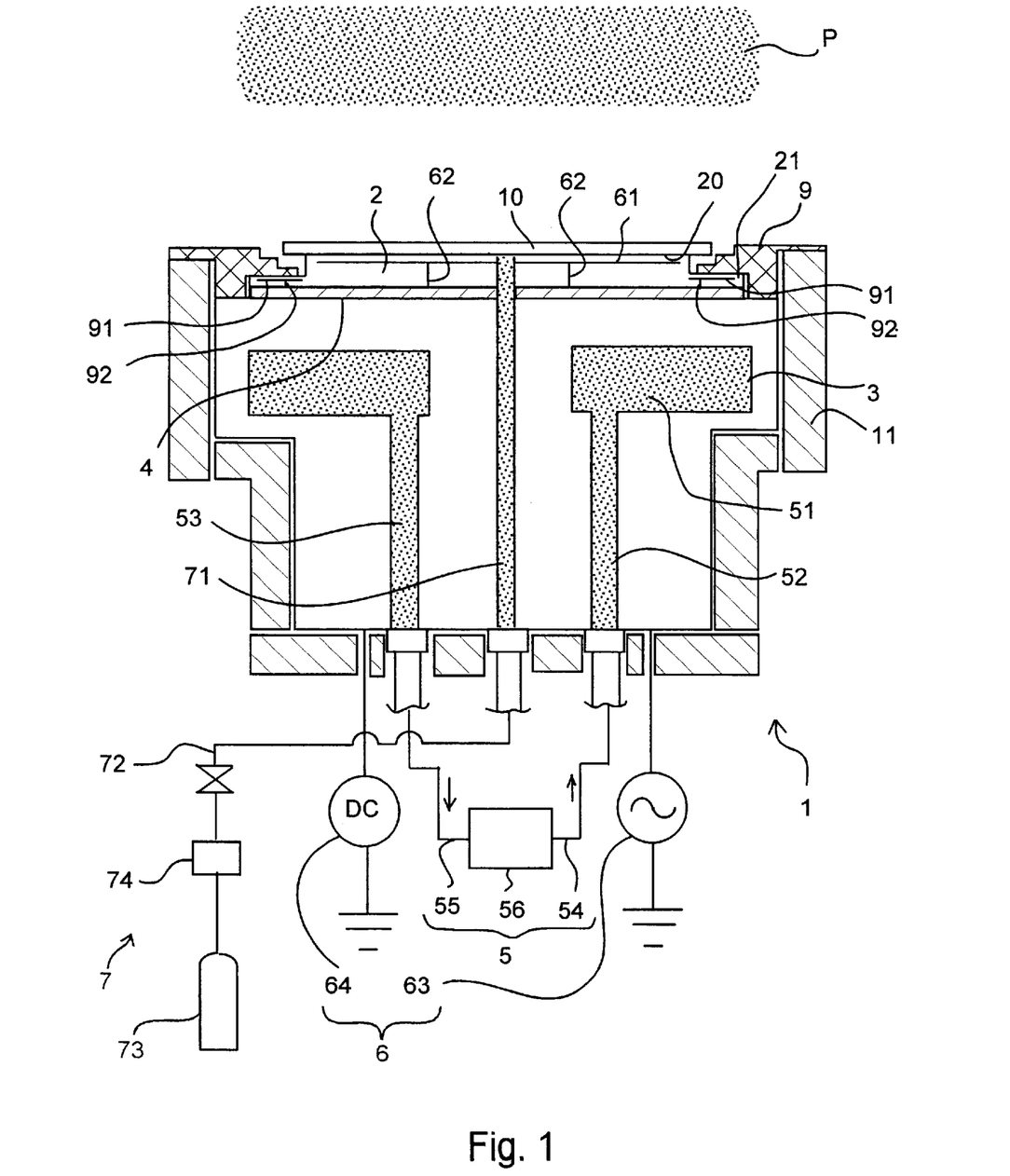
FIG. 1 is a schematic cross-sectional front view of a substrate holder relating to an embodiment of the present invention.

FIG. 1 is a schematic cross-sectional front view of a substrate holder relating to a first embodiment of the present invention. The substrate holder shown in FIG. 1 has a holder main body 1 which holds a substrate 10 against a substrate holding surface 20. The holder main body 1 is provided with a substrate temperature regulation mechanism 5 which controls the temperature of the substrate 10 through the substrate holding surface 20. The substrate 10 is surrounded by a characteristic correction ring 9 which corrects variations in the processing characteristics at the peripheral parts of the substrate 10. The mechanical configuration of a substrate holding plate 2, a main block 3 and a contact sheet material 4 which constitute the holder main body 1 is more or less the same as in the conventional case described above with respect to FIG. 4.

In this description, the term "processing characteristics" refers to the quality variation between each of the substrates that are output in a particular process. The quality means a characteristic of the substrate subjected to processing in the process. These characteristics include all characteristics that might be considered in determining whether to accept a processed substrate.

In the case of etch processing, the processing characteristics include etch characteristics, such as etch uniformity within a substrate, etch profile, etch rate, and the like. In the case of sputter processing, the processing characteristics include film thickness, uniformity within a substrate, film quality such as composition and sheet resistivity, the deposition rate, and the like.

A large benefit of the substrate holder of this first embodiment is that it is provided with a ring cooling means which prevents the characteristic correction ring 9 from accumulating substantial heat from the plasma and rising in temperature as time passes. In the substrate holder of this first embodiment, the substrate temperature regulation mechanism 5 also serves as the ring cooling means.

The substrate temperature regulation mechanism 5 cools the substrate 10 to regulate it to the desired temperature. When processing is performed with plasma, a considerable amount of heat is conferred by the plasma, and if cooling is not performed, the substrate 10 will be heated above the temperature that should be maintained during processing (referred to as the process temperature in the following). In such cases, the substrate 10 is maintained at the process temperature by cooling the substrate 10 to some extent.

For example, if cooling is not done in plasma etching, the temperature of the substrate 10 will reach about 200 to 300° C., but if cooling is performed with the temperature of the temperature medium set to about 10° C., then the substrate 10 is maintained at the process temperature of about 100° C.

To cool the characteristic correction ring 9 in the substrate temperature regulation mechanism 5, the substrate holder of the present embodiment employs a contact improvement means which makes the holder main body 1 contact the characteristic correction ring 9 with good thermal conductivity. The contact improvement means is equipped with an electrostatic chucking mechanism 6 in this embodiment, which improves the contact by making the characteristic correction ring 9 attract electrostatically to the holder main body 1.

Specifically, a ring chucking electrode 91 is embedded in the brim part 21 of the substrate holding plate 2. The ring chucking electrode 91 conducts electricity to the contact sheet material 4 with a conductor 92 in the same way as the chucking electrode 61. The ring chucking electrode 91 is also subjected to the same voltage as the chucking electrode 61.

As FIG. 1 shows, a protrusion of the characteristic correction ring 9 is mounted on the brim part 21, and this protruding part is electrostatically attracted to the brim part 21. The dielectric of the brim part 21 is polarized by the self-bias voltage arising from the interaction between the high frequency power source 63 and the plasma and by the voltage of the DC power source 64. The characteristic correction ring 9 is then attracted to the brim part 21 by the Coulomb force and Johnson-Rahbeck force.

This attraction improves the contact between the substrate holding plate 2 and the characteristic correction ring 5. The substrate temperature regulation mechanism 9 efficiently cools the characteristic correction ring 9 via the substrate holding plate 2. The characteristic correction ring 9 is prevented from storing up heat as time passes and rising in temperature. This avoids the variation in the process characteristics at the peripheral parts of the substrate 10 that is observed when processes are repeated many times.

The specific cooling conditions are as follows: when the density of plasma P supplied to the top of the substrate holder is $10^{10}$ to $10^{11}$ electrons per cubic centimeter and the process temperature is 100° C., the temperature of the temperature medium is set to +10° C. or thereabouts and about 240 calories of heat are removed from the holder main body 1 each minute. Under conditions where the frequency of the high frequency applied by the high frequency power source 63 is 1.6 MHz with an output power of 1400 W, and the voltage applied by the DC power source 64 is −1400 V, the characteristic correction ring 9 is adequately attracted electrostatically to the substrate holding plate 2 and cooled to about 100° C. A temperature that is suitably matched to the process temperature is maintained during processing.

Figure 2:
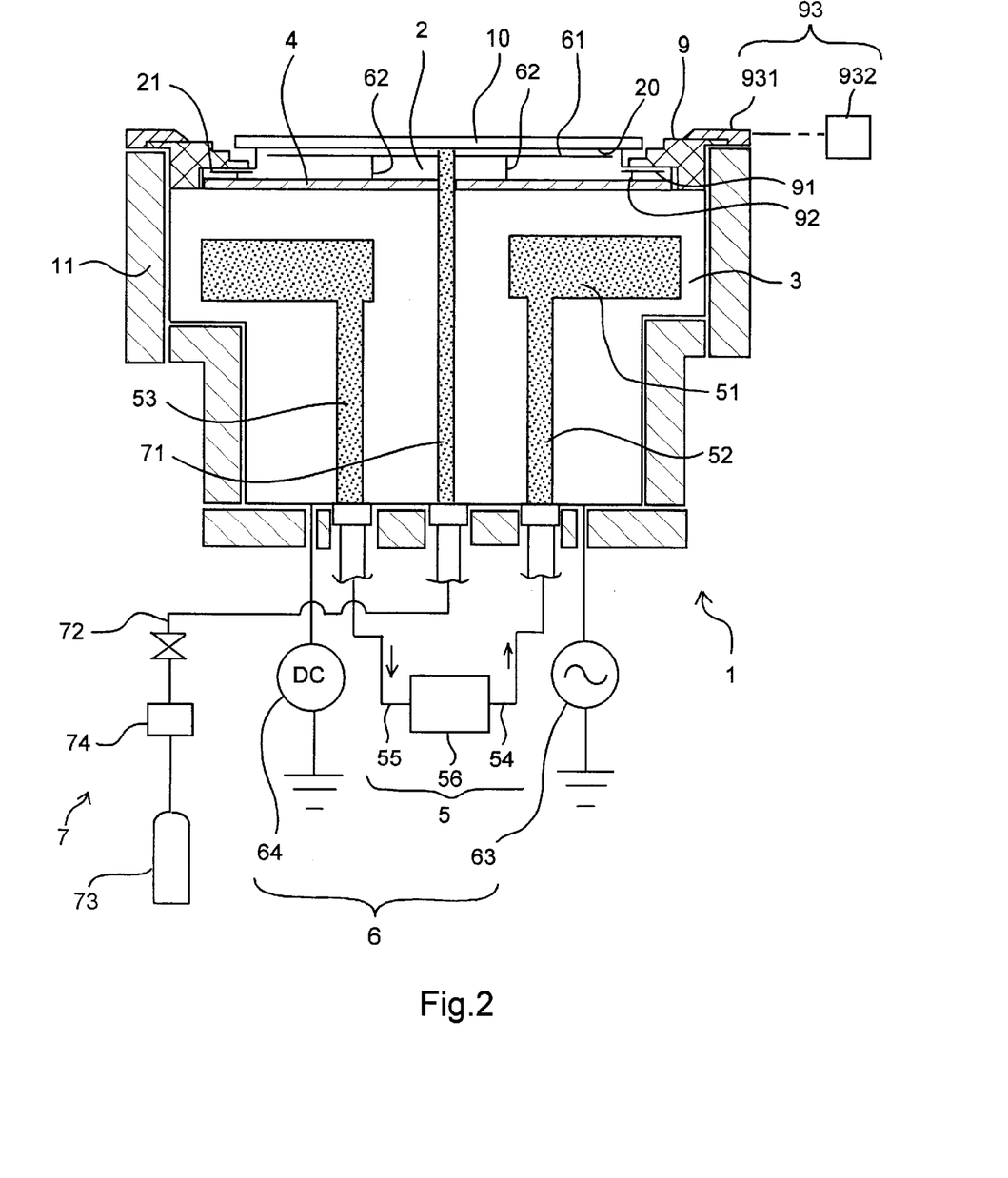
FIG. 2 is a schematic cross-sectional front view of the substrate holder of a second embodiment of the present invention.

Next, a substrate holder relating to a second embodiment of the present invention is described. FIG. 2 is a schematic cross-sectional front view of a substrate holder according to the second embodiment.

The substrate temperature regulation mechanism 5 also serves as the ring cooling means in this second embodiment. The difference from the substrate holder of the first embodiment is that the contact improvement means consists of an electrostatic chucking mechanism 6 and a mechanical clamp mechanism.

The electrostatic chucking mechanism 6 is the same as that mentioned above in the first embodiment. The mechanical clamp mechanism mechanically presses the characteristic correction ring 9 against the holder main body 1. A mechanical clamp mechanism 93 comprises a damper 931 provided above the characteristic correction ring 9 and a drive system 932, which drives the damper 931 so that the damper 931 presses against the characteristic correction ring 9.

The damper 931 is shaped into a ring with a diameter slightly larger than the diameter of the characteristic correction ring 9. The cross-sectional profile of the damper 931 consists of a vertical part and a horizontal part which extends inward at the top end of the vertical part, as shown in FIG.

2. The horizontal part is mounted on the characteristic correction ring 9 and presses against the characteristic correction ring 9.

The detailed configuration of the drive system 932 is omitted from the figure, but it principally consists of a spring member attached to the damper 931 so that an elastic force acts in the direction in which the damper 931 presses against the characteristic correction ring 9, and a linear drive source such as an air cylinder that can lift up the clamper 931 against the elastic force of the spring member.

The clamper 931 is normally pressed against the characteristic correction ring 9 by the spring member of the drive system 932. When the characteristic correction ring 9 is changed during maintenance, the drive system 932 lifts up the clamper 931 and the characteristic correction ring 9 is removed from the holder main body 1.

This mechanical clamp mechanism 93 presses the characteristic correction ring 9 against the holder main body 1 with a pressure of about 5 kg/cm$^2$. Combined with the attraction of the electrostatic chucking mechanism 6, this improves the contact of the characteristic correction ring 9 against the holder main body 1 and the effects of cooling by the ring cooling means are increased.

Figure 3:
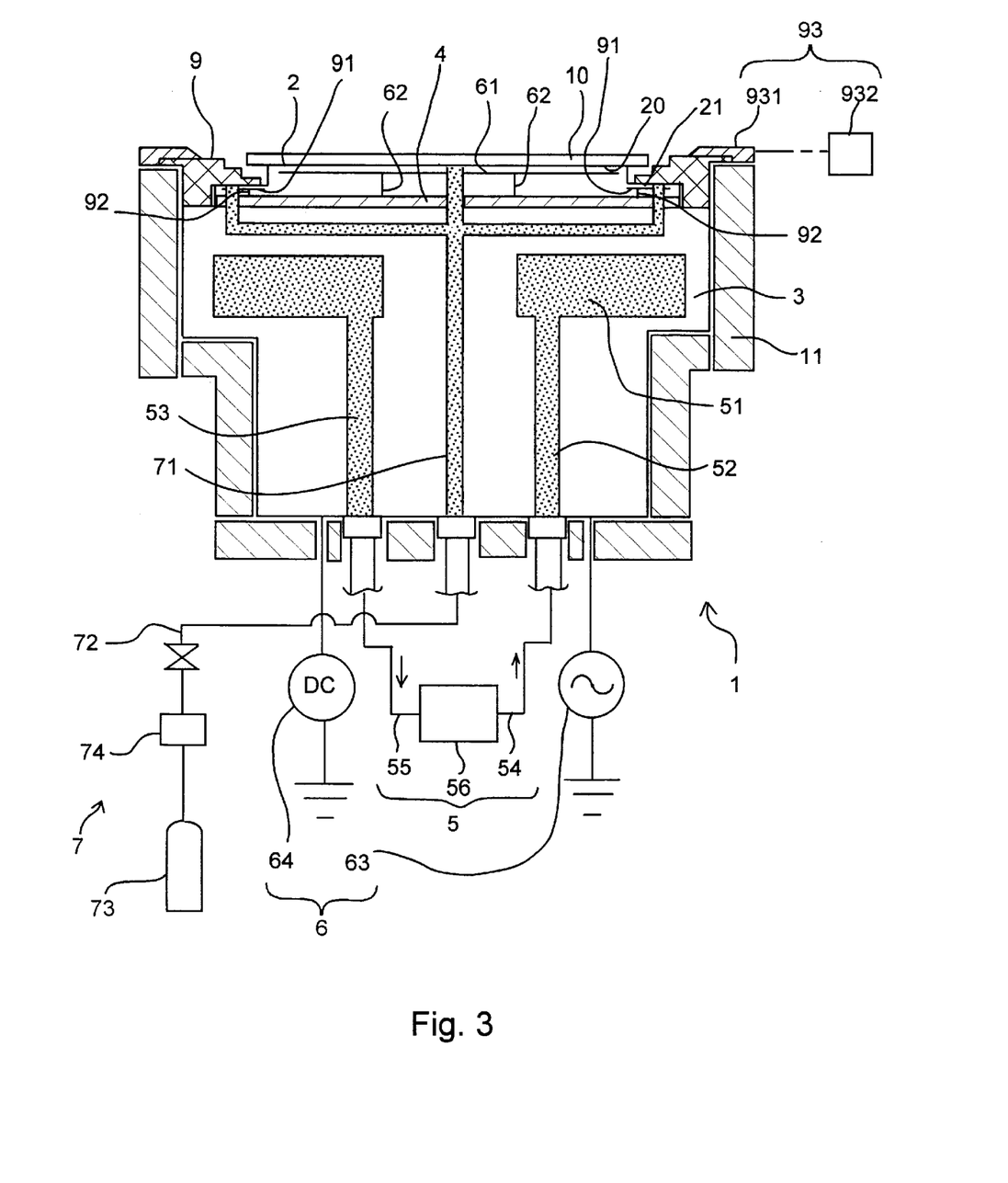
FIG. 3 is a schematic cross-sectional front view of the substrate holder of a third embodiment of the present invention.

Next, a substrate holder relating to a third embodiment of the present invention is described. FIG. 3 is a schematic cross-sectional front view of a substrate holder relating to the third embodiment.

A substrate temperature regulation mechanism 5 also serves as the ring cooling means in this third embodiment. The difference from the substrate holders of the first and second embodiments is that the contact improvement means consists of a gas supply mechanism in addition to the electrostatic chucking mechanism 6 and the mechanical clamp mechanism 93.

The electrostatic chucking mechanism 6 is the same as in the first embodiment, and the mechanical clamp mechanism 93 is the same as in the second embodiment. A gas supply mechanism 7, which supplies gas between the substrate 10 and the substrate holding surface 20, also serves as the gas supply mechanism.

In this embodiment, as FIG. 3 shows, a gas supply path 71 extends from top to bottom in the middle of the holder main body 1 with the tip of the gas supply path 71 reaching an opening in the substrate holding surface 20. The gas supply path 71 also branches horizontally inside the main block 3, and is bent upward at the bottom of the brim part 21 of the substrate holding plate 2, passing through the brim part 21.

Gas is also supplied between the brim part 21 and the characteristic correction ring 9 above it. The efficiency of heat exchange between the characteristic correction ring 9 and the substrate holding plate 2 is improved by thermal conduction through the gas. The efficiency with which the characteristic correction ring 9 is cooled by the substrate temperature regulation mechanism 5 is further improved. The effect of improving the process characteristics by suppressing increases in the temperature of the characteristic correction ring 9 as time passes is further increased.

The gas supplied by the gas supply mechanism 7 is a gas with high thermal conductivity, such as helium, but if the pressure of this gas is increased a cooling effect is also obtained by the exchange of heat with the gas, which is desirable. For example, when the plasma density is $10^{10}$ to $10^{11}$ electrons per cubic centimeter, and the process temperature is 100° C., the pressure of the helium gas is maintained at about 30 Torr. The temperature of the characteristic correction ring 9 is kept down to about 100° C., and there is no observed increase in temperature as time passes due to the accumulation of heat.

In the substrate holders of each of the abovementioned embodiments, the contact improvement means can be just a mechanical clamp mechanism 93, or it can be the combination of an electrostatic chucking mechanism 6 and a gas supply mechanism 7, or it can be the combination of a mechanical clamp mechanism 93 and a gas supply mechanism 7.

When the substrate temperature regulation mechanism 5 also serves as the ring cooling means which cools the characteristic correction ring 9, the cost can be reduced and the structure of the holder main body 1 can be simplified. When the means that increases the contact of the substrate 10 against the substrate holding surface 20 also serves as the means that improves the contact of the characteristic correction ring 9 against the holder main body 1, the cost is reduced and the structure inside the holder main body 1 is simplified.

In each of the embodiments, the substrate 10 is mounted on a substrate holding plate 2 and the substrate 10 is held horizontally. However, it is also possible for the whole substrate holder to be oriented sideways whereby the substrate holder 2 can be held vertically. By turning the entire substrate holder upside down, the substrate 10 can also be held with the surface to be processed pointing downward.

The substrate holders in each of the embodiments mentioned above can be used not only in plasma processing systems using helicon wave excited plasma as mentioned above, but also in various other types of plasma processing systems. For example they can be used in plasma processing systems such as ECR (electron cyclotron resonance) plasma processing systems or high-frequency plasma processing systems where high-frequency circuits are combined in the volume of the discharge space, or in plasma processing systems where plasma is formed by diode DC discharge.

What is claimed is:

1. A substrate holder for a plasma processing system that forms plasma inside a process chamber and processes a substrate with the plasma, and which holds the substrate at a position in which it is processed by the plasma inside the process chamber, the substrate holder comprising:

a holder main body whose surface is made into a substrate holding surface that is brought into planar contact with and holds the substrate, a substrate temperature regulation mechanism that performs heat exchange across the substrate holding surface and maintains the substrate at a substantially fixed temperature, a relaceable characteristic correction ring which is a ring-shaped member that encloses the circumference of the substrate and corrects fluctuations in process characteristics at the peripheral parts of the substrate, and a contact improvement means provided on the characteristic correction ring, said contact improvement means includes means for urging the replaceable characteristic correction ring against the holder main body with a force to improve the contact between the holder main body and the characteristic correction ring, thereby increasing the thermal conductivity therebetween and reducing the amount of heat stored by the characteristic correction ring.

2. The substrate holder of claim 1, wherein the substrate temperature regulation mechanism regulates the substrate to a substantially fixed temperature by cooling it and the characteristic correction ring makes planar contact with the holder main body and is cooled by the substrate temperature regulation mechanism.

3. The substrate holder of claim 2, wherein the contact improvement means comprises at least one of:

a static adhesion mechanism that causes the replaceable characteristic correction ring to adhere electrostatically to the holder main body, a mechanical clamp mechanism that mechanically presses the rpaceable characteristic correction ring against the holder main body, and a combination of the static adhesion mechanism and the mechanical clamp mechanism.

4. The substrate holder of claim 3, wherein the contact improvement means further comprises a gas supply mechanism that supplies a heat-exchange gas between the replaceable characteristic correction ring and the holder main body to improve the contact between the characteristic correction ring and the holder main body.

5. The substrate holder of claim 1, wherein the contact improvement means also includes means for improving the planar contact of the substrate to the substrate holding surface.

6. The substrate holder of claim 1, wherein the replaceable characteristic correction ring is made from the same material as the substrate.

7. The substrate holder of claim 1, wherein the replaceable characteristic correction ring is made from a material selected from the group consisting of silicon, silicon carbide, carbon, quartz, aluminum and alumetized aluminum.

8. The substrate holder of claim 1, wherein the replaceable characteristic correction ring has an inwardly oriented protrusion.

9. The substrate holder of claim 1, wherein the contact improvement means comprises a static adhesion mechanism that causes the replaceable characteristic correction ring to adhere electrostatically to the holder main body.

10. The substrate holder of claim 1, wherein the contact improvement means comprises a mechanical clamp mechanism that mechanically presses the replaceable characteristic correction ring against the holder main body.

11. The substrate holder of claim 1, wherein the contact improvement means comprises a combination of a static adhesion mechanism and a mechanical clamp mechanism.

* * * * *